US012615998B2

(12) United States Patent
Biard et al.

(10) Patent No.: US 12,615,998 B2
(45) Date of Patent: Apr. 28, 2026

---

(54) DETACHABLE TEMPORARY SUBSTRATE COMPATIBLE WITH VERY HIGH TEMPERATURES AND PROCESS FOR TRANSFERRING A WORKING LAYER FROM THE SUBSTRATE

(71) Applicant: Soitec, Bernin (FR)

(72) Inventors: Hugo Biard, Grenoble (FR); Gweltaz Gaudin, Crolles (FR); Séverin Rouchier, Saint Jean de Soudain (FR); Didier Landru, Le Champ-près-Froges (FR)

(73) Assignee: Soitec, Bernin (FR)

( * ) Notice: Subject to any disclaimer, the term of this patent is extended or adjusted under 35 U.S.C. 154(b) by 515 days.

(21) Appl. No.: 18/001,033

(22) PCT Filed: Apr. 26, 2021

(86) PCT No.: PCT/FR2021/050718
§ 371 (c)(1),
(2) Date: Dec. 7, 2022

(87) PCT Pub. No.: WO2021/250333
PCT Pub. Date: Dec. 16, 2021

(65) Prior Publication Data
US 2023/0230868 A1 Jul. 20, 2023

(30) Foreign Application Priority Data

Jun. 9, 2020 (FR) ...................................... 2006023

(51) Int. Cl.
*H01L 21/683* (2006.01)
*H01L 21/18* (2006.01)
(Continued)

(52) U.S. Cl.
CPC ........ *H01L 21/6835* (2013.01); *H01L 21/187* (2013.01); *H01L 21/3221* (2013.01);
(Continued)

(58) Field of Classification Search
CPC ............... H01L 21/6835; H01L 21/187; H01L 21/3221; H01L 21/324; H01L 2221/68368;
(Continued)

(56) References Cited

U.S. PATENT DOCUMENTS 5,374,564 A * 12/1994 Bruel .................... G01L 9/0042
438/455
6,323,108 B1 * 11/2001 Kub .................. H01L 21/76254
438/459
(Continued)

FOREIGN PATENT DOCUMENTS

FR 2977069 B1 2/2014
KR 10-2006-0069022 A 6/2006
TW 201935519 A 9/2019

OTHER PUBLICATIONS

International Search Report for International Application No. PCT/FR2021/050718 dated Jul. 7, 2021, 2 pages.
(Continued)

*Primary Examiner* — Vu A Vu
(74) *Attorney, Agent, or Firm* — TraskBritt

(57) ABSTRACT

A temporary substrate, which is detachable at a detachment temperature higher than 1000° C. comprises:
    a semiconductor working layer extending along a main plane,
    a carrier substrate,
    an intermediate layer having a thickness less than 20 nm arranged between the working layer and the carrier substrate,
(Continued)

a bonding interface located in or adjacent the intermediate layer, gaseous atomic species distributed according to a concentration profile along the axis normal to the main plane, the atoms remaining trapped in the intermediate layer and/or in an adjacent layer of the carrier substrate with a thickness less than or equal to 10 nm and/or in an adjacent sublayer of the working layer with a thickness less than or equal to 10 nm when the temporary substrate is subjected to a temperature lower than the detachment temperature.

19 Claims, 7 Drawing Sheets

(51) Int. Cl.
  *H01L 21/322* (2006.01)
  *H01L 21/324* (2006.01)
(52) U.S. Cl.
  CPC .. *H01L 21/324* (2013.01); *H01L 2221/68368* (2013.01); *H01L 2221/68381* (2013.01)
(58) Field of Classification Search
  CPC ... H01L 2221/68381; H01L 2221/6835; H01L 21/76254
  USPC .......................................................... 257/678
  See application file for complete search history.

(56) References Cited

U.S. PATENT DOCUMENTS

| | | | | |
|---|---|---|---|---|
| 6,326,279 | B1 * | 12/2001 | Kakizaki | H01L 21/76259 |
| | | | | 438/455 |
| 6,964,914 | B2 * | 11/2005 | Ghyselen | H01L 21/76254 |
| | | | | 257/E21.127 |
| 6,974,759 | B2 * | 12/2005 | Moriceau | H01L 21/76256 |
| | | | | 438/459 |
| 7,008,859 | B2 * | 3/2006 | Letertre | H01L 21/2258 |
| | | | | 438/479 |
| 7,008,860 | B2 * | 3/2006 | Kakizaki | H01L 21/76254 |
| | | | | 438/459 |
| 7,226,509 | B2 * | 6/2007 | Faure | C30B 25/183 |
| | | | | 257/E21.119 |
| 7,229,898 | B2 * | 6/2007 | Bourdelle | H01L 21/76254 |
| | | | | 438/455 |
| 7,300,853 | B2 * | 11/2007 | Joly | H01L 21/76251 |
| | | | | 438/455 |
| 7,387,947 | B2 * | 6/2008 | Cayrefourcq | H01L 21/76254 |
| | | | | 257/E21.6 |
| 7,485,551 | B2 * | 2/2009 | Hebras | H01L 21/76254 |
| | | | | 438/526 |
| 7,538,010 | B2 * | 5/2009 | Faure | C30B 29/403 |
| | | | | 438/459 |
| 7,601,217 | B2 * | 10/2009 | Faure | C30B 25/18 |
| | | | | 438/528 |
| 8,153,500 | B2 * | 4/2012 | Faure | H01L 21/76254 |
| | | | | 438/464 |
| 8,436,363 | B2 * | 5/2013 | Werkhoven | H10D 62/00 |
| | | | | 257/E33.025 |
| 9,099,526 | B2 * | 8/2015 | Or-Bach | H10D 86/201 |
| 9,242,444 | B2 * | 1/2016 | Faure | H01L 21/76254 |
| 9,330,958 | B2 * | 5/2016 | Gaudin | H01L 21/02595 |
| 10,529,616 | B2 * | 1/2020 | Wang | H01L 21/02052 |
| 2007/0054466 | A1 | 3/2007 | Hebras | |
| 2012/0199845 | A1 * | 8/2012 | Werkhoven | H10D 62/00 |
| | | | | 257/77 |
| 2012/0309269 | A1 * | 12/2012 | Khayyat | H01L 21/187 |
| | | | | 451/28 |
| 2014/0295673 | A1 | 10/2014 | Shero et al. | |
| 2017/0278930 | A1 | 9/2017 | Ruhl et al. | |

OTHER PUBLICATIONS

International Written Opinion for International Application No. PCT/FR2021/050718 dated Jul. 7, 2021, 5 pages.

Taiwanese Office Action for Application No. 110115168 dated Sep. 25, 2024, 8 pages with machine translation.

Chinese Office Action for Application No. 202180041093.0 dated Jun. 30, 2025, 13 pages with English translation.

Korean Notice of Preliminary Rejection for Korean Application No. 10-2022-7043218, dated Dec. 30, 2024, 10 pages with English translation.

\* cited by examiner

1

DETACHABLE TEMPORARY SUBSTRATE COMPATIBLE WITH VERY HIGH TEMPERATURES AND PROCESS FOR TRANSFERRING A WORKING LAYER FROM THE SUBSTRATE

CROSS-REFERENCE TO RELATED APPLICATIONS

This application is a national phase entry under 35 U.S.C. § 371 of International Patent Application PCT/FR2021/050718, filed Apr. 26, 2021, designating the United States of America and published as International Patent Publication WO 2021/250333 A1 on Dec. 16, 2021, which claims the benefit under Article 8 of the Patent Cooperation Treaty to French Patent Application Serial No. FR2006023, filed Jun. 9, 2020.

TECHNICAL FIELD

The present disclosure relates to the field of semiconductor materials for microelectronic components. In particular, it relates to a temporary substrate that is detachable at a temperature higher than 1000° C., or even higher than 1200° C., and to a process for producing such a temporary substrate. The present disclosure further relates to a process for transferring a working layer, for example, made of monocrystalline silicon carbide, from the temporary substrate to a receiver substrate.

BACKGROUND

Interest in silicon carbide (SiC) has increased considerably over the last few years because this semiconductor material can increase the energy handling capacity. SiC is increasingly widely used for producing innovative power devices to meet the needs of rising fields in electronics, notably such as electric vehicles.

Power devices and integrated power supply systems based on monocrystalline silicon carbide are able to manage a much higher power density in comparison with their conventional homologues made of silicon, and do so with smaller active-zone dimensions. To further limit the dimensions of power devices on SiC, it is advantageous to produce vertical instead of lateral components. For this, vertical electrical conduction, between an electrode positioned on the front face of the SiC structure and an electrode positioned on the back face, must be allowed by the structure.

Nevertheless, monocrystalline SiC substrates intended for the microelectronics industry remain expensive and difficult to supply at a large size. It is thus advantageous to make use of thin-layer transfer solutions to produce composite structures that typically comprise a thin layer of monocrystalline SiC on a less expensive carrier substrate. One well-known thin-layer transfer solution is the Smart Cut™ process, based on implanting light ions and joining by direct bonding. Such a process makes it possible to produce, for example, a composite structure comprising a thin layer made of monocrystalline SiC (c-SiC), taken from a donor substrate made of c-SiC, in direct contact with a carrier substrate made of polycrystalline SiC (p-SiC), and allowing vertical electrical conduction.

Furthermore, U.S. Pat. No. 8,436,363 describes a process for the production of a composite structure comprising a thin layer made of c-SiC arranged on a metal carrier substrate, the coefficient of thermal expansion of which is matched to that of the thin layer. This production process comprises forming a buried weakened plane in a c-SiC donor substrate, delimiting a thin layer between the buried weakened plane and a front surface of the donor substrate. Next, a layer of metal, for example, of tungsten or molybdenum, is deposited on the front surface of the donor substrate to form the carrier substrate with sufficient thickness to act as a stiffener. Lastly, the process comprises separating along the buried weakened plane to form, on the one hand, the composite structure comprising the metal carrier substrate and the thin layer made of c-SiC and, on the other hand, the rest of the c-SiC donor substrate.

Such a production process is, however, not compatible when the material forming the carrier substrate is p-SiC requiring deposition at temperatures above 1200° C. (usual temperatures for the production of p-SiC). Specifically, at these high temperatures, the growth kinetics of the cavities present in the buried weakened plane are faster than the growth kinetics of the p-SiC layer and the thickness required for a stiffening effect is not reached before blistering starts to occur, which is related to the deformation of the layer vertically in line with the cavities.

BRIEF SUMMARY

The present disclosure relates to an alternative solution to those of the prior art, and aims to completely or partly overcome the abovementioned drawbacks. In particular, it relates to a temporary substrate that is detachable at very high temperatures and to an associated production process; it further relates to a process for transferring a working layer, which may be, in particular, made of monocrystalline silicon carbide, from the temporary substrate to a receiver substrate, in order to form a composite structure.

The present disclosure relates to a temporary substrate, which is detachable at a detachment temperature higher than 1000° C. and comprises:

a semiconductor working layer extending along a main plane, a carrier substrate, an intermediate layer arranged between the working layer and the carrier substrate, and having a thickness, along an axis normal to the main plane, less than 20 nm, a bonding interface located in the intermediate layer or adjacent thereto, atoms of at least one gaseous species that are distributed according to a concentration profile along the axis normal to the main plane, with a maximum concentration higher than $10^{21}/cm^3$, the atoms remaining trapped in the intermediate layer and/or in an adjacent layer of the carrier substrate with a thickness less than or equal to 10 nm and/or in an adjacent sublayer of the working layer with a thickness less than or equal to 10 nm when the temporary substrate is subjected to a temperature lower than the detachment temperature, and the atoms being intended to diffuse to a detachment interface when the temporary substrate is subjected to a temperature higher than or equal to the detachment temperature.

According to other advantageous and non-limiting features of the present disclosure, taken alone or in any technically feasible combination:

the working layer comprises silicon carbide, diamond and/or gallium nitride;

the intermediate layer is formed by at least one material chosen from among tungsten, nickel, titanium, aluminum, molybdenum, tantalum, titanium nitride, tantalum nitride, amorphous silicon;

the gaseous species is nitrogen, helium, argon, xenon and/or hydrogen;

the carrier substrate comprises a material the coefficient of thermal expansion of which is equal to or close to that of the working layer.

The present disclosure also relates to a process for producing a temporary substrate as above, comprising:

a) a step of providing a donor substrate, b) a step of implanting light ions chosen from among hydrogen, helium, or a combination of the two into the donor substrate in order to form a buried weakened plane in the donor substrate, the buried weakened plane delimiting a surface working layer with a front face of the donor substrate, c) a step of providing a carrier substrate having a front face, d) a step of depositing at least one film on the front face of the donor substrate and/or on the front face of the carrier substrate, the at least one film being intended to form the intermediate layer, e) joining the donor substrate and the carrier substrate such that the at least one film is arranged between the substrates so as to form the intermediate layer, f) separating along the buried weakened plane in order to form, on the one hand, the temporary substrate and, on the other hand, the rest of the donor substrate.

The production process further comprises a step of introducing atoms of the at least one gaseous species:

into the donor substrate and/or into the carrier substrate to a depth less than or equal to 10 nm from their respective front faces, before deposition step d), or into the at least one film, after deposition step d), or into the intermediate layer, after separation step f).

According to other advantageous and non-limiting features of the present disclosure, taken alone or in any technically feasible combination:

step a) of providing the donor substrate comprises epitaxial growth of a donor layer on an initial substrate, to form the donor substrate;

the initial substrate and the donor layer are made of silicon carbide, and step a) comprises the formation, on the initial substrate, of a monocrystalline conversion layer, to convert basal plane dislocation defects of the initial substrate into threading edge dislocation defects, prior to the epitaxial growth of the donor layer;

the epitaxial growth is performed at a temperature above 1200° C., preferentially between 1500° C. and 1650° C.;

step f) comprises a heat treatment at a temperature of between 900° C. and 1200° C.

Lastly, the present disclosure relates to a process for transferring a working layer from a temporary substrate as above to a receiver substrate. The process comprises:

g) a step of forming a detachable structure comprising a receiver substrate arranged on the working layer of the temporary substrate, the formation step involving a treatment at a first temperature higher than or equal to 1000° C., h) a step of detaching the detachable structure along a detachment interface in or adjacent to the intermediate layer, the detachment step comprising a heat treatment at a detachment temperature higher than the first temperature in order to form, on the one hand, a composite structure comprising the working layer arranged on the receiver substrate and, on the other hand, the carrier substrate.

According to other advantageous and non-limiting features of the present disclosure, taken alone or in any technically feasible combination:

step g) comprises the deposition of a receiver substrate on a free face of the working layer of the temporary substrate;

the deposition of the receiver substrate is performed by, thermal or enhanced, chemical vapor deposition, or by evaporation, at a temperature higher than or equal to 1000° C., preferably higher than or equal to 1200° C.;

the receiver substrate formed is made of polycrystalline silicon carbide;

the receiver substrate is a bulk substrate and step g) comprises joining the receiver substrate to the free face of the working layer of the temporary substrate;

the joining comprises direct bonding by molecular adhesion and a heat treatment at a temperature higher than or equal to 1000° C., or even higher than or equal to 1200° C.;

step h) comprises a heat treatment at a temperature higher than or equal to 1400° C., or even higher than or equal to 1500° C.;

the transfer process comprises a step i) of finishing the composite structure, including an operation of chemical cleaning and/or chemical etching and/or chemical-mechanical polishing of the free face of the working layer, front face of the composite structure;

step i) comprises an operation of chemical cleaning and/or chemical etching and/or mechanical grinding and/or chemical-mechanical polishing of the free face of the receiver substrate, back face of the composite structure;

the transfer process comprises a step g') of treating the detachable structure, prior to detachment step h), including an operation of chemical cleaning and/or chemical etching and/or mechanical grinding and/or chemical-mechanical polishing of the back face of the receiver substrate;

the transfer process comprises a step j) of reconditioning the carrier substrate, with a view to reusing it as carrier substrate for a new temporary substrate;

the transfer process comprises the production of electronic components in or on the working layer of the composite structure, potentially after the epitaxial growth of an additional layer on the working layer.

BRIEF DESCRIPTION OF THE DRAWINGS

Other features and advantages of the present disclosure will become apparent from the following detailed description of example embodiments of the present disclosure, which is given with reference to the accompanying figures, in which.

DETAILED DESCRIPTION

Figure 1A:
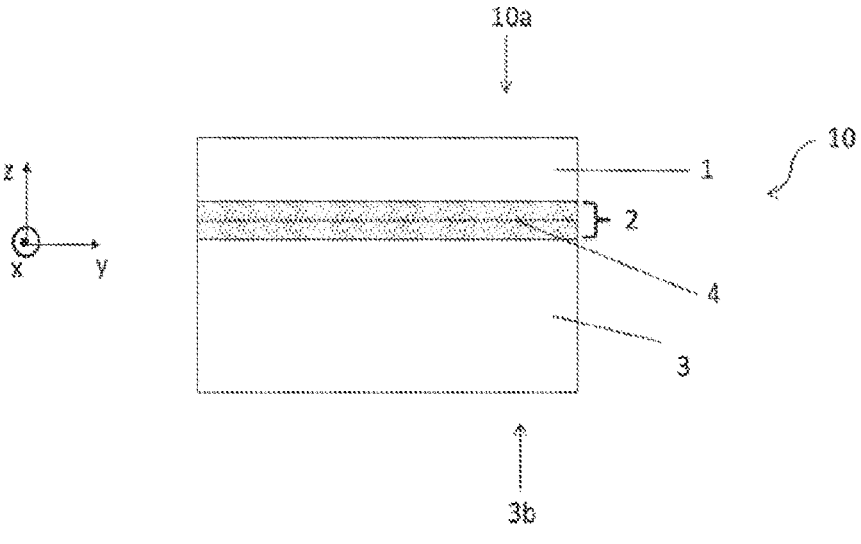
FIGS. 1A and 1B show a detachable temporary substrate according to the present disclosure, FIG. 1B showing a close-up of the intermediate layer of the substrate.

In the description, the same reference numerals in the figures may be used for elements of the same type. The figures are schematic representations that, for the sake of readability, are not to scale. In particular, the thicknesses of the layers along the z axis are not to scale with respect to the lateral dimensions along the x and y axes; and the relative thicknesses of the layers with respect to one another are not necessarily respected in the figures.

The present disclosure relates to a temporary substrate 10 that is detachable at a detachment temperature higher than 1000° C., preferably even higher than 1200° C., higher than 1300° C., higher than 1400° C., or higher than 1500° C. What is meant by detachable is that the temporary substrate 10 is able to be separated into two portions, at very high temperatures: in this instance, it allows the transfer of a working layer 1 to a final receiver substrate by detaching the working layer 1 from a carrier substrate 3, both portions of the temporary substrate 10.

Figure 1B:
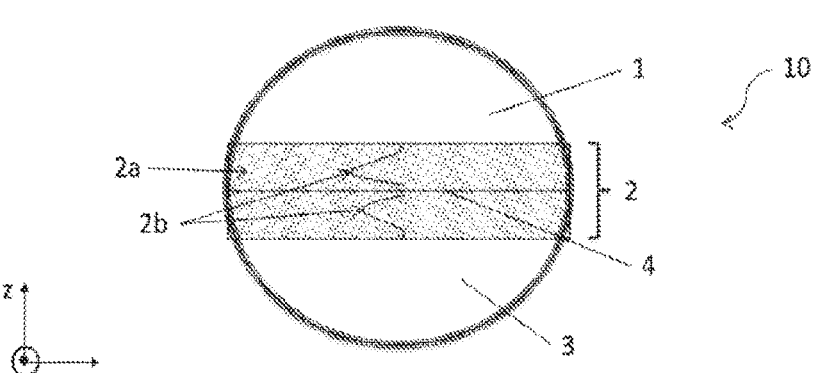

The temporary substrate 10 is preferably provided in the form of a wafer with a diameter of 100 mm, 150 mm, 200 mm, or even potentially 450 mm, and with a thickness typically of between 300 and 800 µm. It has a front face 10a and a back face 3b, extending along a main plane (x,y), as illustrated in FIGS. 1A and 1B.

The temporary substrate 10 comprises a semiconductor working layer 1 arranged on an intermediate layer 2, itself arranged on a carrier substrate 3. It also comprises a bonding interface 4, located either in the intermediate layer 2 or adjacent thereto, namely located between the intermediate layer 2 and the working layer 1 or between the intermediate layer 2 and the carrier substrate 3.

The working layer 1, made of a semiconductor material, is the layer in or on which components are intended to be produced, in order to address a given application. Since the temporary substrate 10 is particularly suited to semiconductor materials that require very high treatment temperatures, the working layer 1 advantageously comprises silicon carbide. Of course, it could also comprise one or more materials chosen from among diamond, binary or ternary III-V compounds that require high production temperatures, such as, for example, gallium nitride or aluminum nitride, or II-VI compounds that also require high treatment or production temperatures (typically higher than 1000° C. or than 1200° C.).

The working layer 1 is arranged on the intermediate layer 2, itself included in the temporary substrate 10. The latter has a thickness, along an axis z normal to the main plane (x,y), that is less than 20 nm, or even less than 10 nm. This low thickness is important in that it allows the temporary substrate 10 to retain a good mechanical strength and good compatibility with very high temperatures, even if the one or more constituent materials of the intermediate layer 2 have a creep or melting temperature below the detachment temperature.

It should be noted that the intermediate layer 2 may extend continuously parallel to the main plane (x,y) or discontinuously, for example, in the form of nodules arranged side by side in a plane parallel to the main plane (x,y).

The intermediate layer 2 may be formed by at least one metal or semiconductor material, for example, chosen from among tungsten, nickel, titanium, aluminum, molybdenum, tantalum, titanium nitride, tantalum nitride and amorphous silicon.

The material of the intermediate layer 2 is chosen such that it does not diffuse into the working layer 1 and/or such that it does not react, or hardly reacts, namely over a very low thickness of the working layer 1 (less than 10 nm), at the very high temperatures that will be applied during the transfer process implementing the temporary substrate 10. This allows the integrity and purity of the working layer 1 to be maintained.

The intermediate layer 2 is arranged on the carrier substrate 3, also forming part of the temporary substrate 10. The carrier substrate 3 may be formed of any material compatible with the high temperatures required or targeted for the treatment of the working layer 1. Preferably, the carrier substrate 3 comprises a material, the coefficient of thermal expansion of which is equal or close to that of the working layer 1. For example, it could be chosen so as to be of the same nature as the working layer 1, while exhibiting a lower crystal quality.

In the particular case of a working layer 1 made of silicon carbide, for example, the carrier substrate 3 may itself be formed of monocrystalline silicon carbide, of lower crystal quality than the working layer 1, or polycrystalline silicon carbide.

The temporary substrate 10 further comprises atoms 2a of at least one gaseous species that are distributed according to a concentration profile 2b along the axis z, with a minimum concentration higher than 1021/cm3.

As will be described in detail further on in the process for producing the temporary substrate 10, these atoms 2a may be introduced at different times in the process and at different locations in the substrates and layers involved.

The concentration profile 2b of the atoms 2a may therefore take various forms: one example is illustrated in FIG. 1B in which the atoms 2a are located mostly in the intermediate layer 2. Alternatively, the atoms 2a may be mostly located in a layer of the carrier substrate 3, adjacent to the intermediate layer 2, the thickness of which is less than or equal to 10 nm: in other words, the atoms 2a are then mostly in the carrier substrate 3 but are very close to the intermediate layer 2. As yet another alternative, the atoms 2a may be mostly located in a sublayer of the working layer 1, adjacent to the intermediate layer 2, the thickness of which is less than or equal to 10 nm.

Whatever the location of the atoms 2a, it is necessary for the concentration profile 2b to comprise a region in which the concentration of atoms 2a is at maximum and reaches a value higher than or equal to 1021/cm3, or even higher than or equal to a few $10^{21}/cm^3$, typically $2^E21/cm^3$ to $5^E21/cm^3$.

According to the present disclosure, the atoms 2a remain trapped in the intermediate layer 2 and/or in the adjacent layer of the carrier substrate 3 with a thickness less than or equal to 10 nm and/or in the adjacent sublayer of the working layer 1 with a thickness less than or equal to 10 nm when the temporary substrate 10 is subjected to a temperature lower than the detachment temperature. These atoms 2a are intended to diffuse to a detachment interface that is coincident with or close to the bonding interface 4, in the intermediate layer 2 or adjacent thereto, when the temporary substrate 10 is subjected to a temperature higher than or equal to the detachment temperature.

The material of the intermediate layer 2 and the gaseous species are chosen such that:

the atoms remain mostly trapped in the intermediate layer 2 by virtue of the high solubility of the gaseous species in the intermediate layer 2 when the temporary substrate 10 is subjected to a temperature lower than the detachment temperature, or they remain mostly trapped in the adjacent thin layer of the carrier substrate 3 and/or in the adjacent thin sublayer of the working layer 1 because the intermediate layer 2 forms an effective barrier for the species when the temporary substrate 10 is subjected to a temperature lower than the detachment temperature.

The trapped atoms 2a will therefore mostly accumulate at the detachment interface beyond a critical temperature (the detachment temperature) and cause detachment along the interface as will be described further on in the transfer process using the temporary substrate 10.

The gaseous species is preferably chosen from among nitrogen, helium, argon, xenon and/or hydrogen.

A process for producing the temporary substrate 10 will now be described with reference to FIGS. 2A-2G, 3A, and 3B.

Figure 2A:
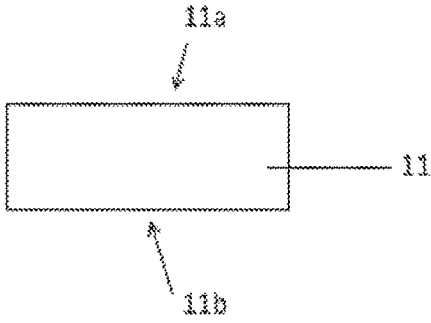
FIGS. 2A-2F show a process for producing the detachable temporary substrate according to the present disclosure.

The production process first comprises a step a) of providing a donor substrate 11 having a front face 11a and a back face 11b (FIG. 2A). The donor substrate 11 will give rise to the working layer 1 of the temporary substrate 10; it therefore comprises at least the material forming the working layer 1.

The surface roughness of the front face 11a of the donor substrate 11 is advantageously chosen to be less than 1 nm Ra (average roughness), measured by atomic force microscopy (AFM) on a scan of 20 μm×20 μm.

According to a first option, the donor substrate 11 is a bulk substrate, provided with the desired level of quality for the working layer 1, this layer coming directly from the donor substrate 11.

Figure 3A:
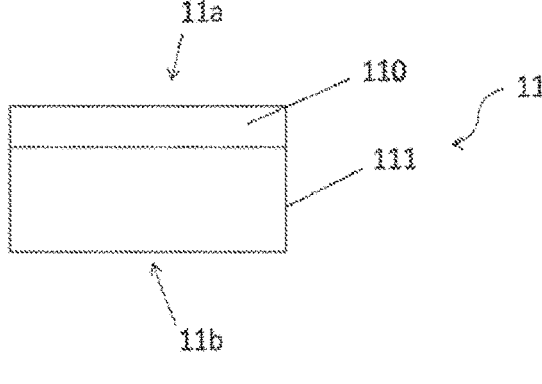
FIGS. 3A and 3B show particular embodiments of step a) of the production process according to the present disclosure.

According to a second option, step a) comprises epitaxial growth of a donor layer 110 on an initial substrate 111, to form the donor substrate 11. The donor layer 110 preferably has a density of crystal defects lower than that of the initial substrate 111 (FIG. 3A).

Figure 3B:
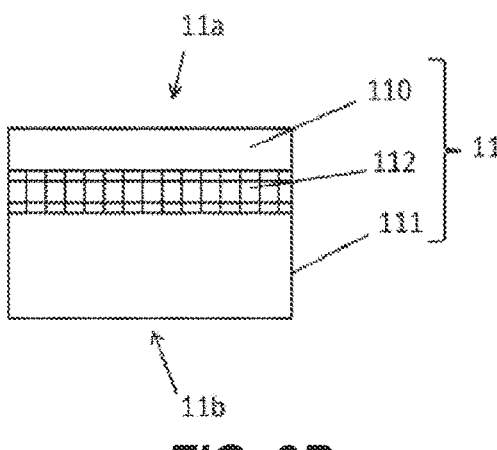

In the particular case in which the initial substrate 111 and the donor layer 110 are made of silicon carbide, step a) may comprise the formation, on the initial substrate 111, of a monocrystalline conversion layer 112, to convert basal plane dislocation defects of the initial substrate 111 into threading edge dislocation defects, prior to the epitaxial growth of the donor layer 110 (FIG. 3B). For example, a BPD defect density lower than or equal to 1/cm² in the donor layer 110 will be targeted.

The epitaxial growth of the silicon carbide is carried out at a temperature higher than 1200° C., preferentially between 1500° C. and 1650° C. The precursors used are monosilane (SiH₄), propane (C₃H₈) or ethylene (C₂H₄); the carrier gas may be hydrogen, with or without argon.

It should be noted that conventional sequences of cleaning and/or etching the initial substrate 111, aiming to remove all or some of the particulate, metallic or organic contaminants or a layer of native oxide that are potentially present on its front face, may be carried out prior to the epitaxial growth of the donor layer 110 (and/or of the conversion layer 112).

Figure 2B:
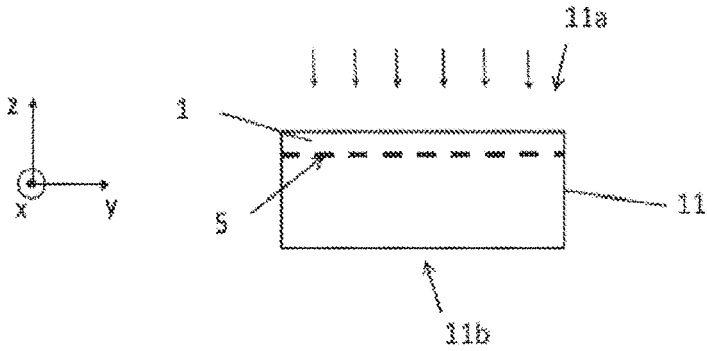

The production process next comprises a step b) of implanting light ions chosen from among hydrogen, helium or a combination of both species into the donor substrate 11 (and, in particular, into the donor layer 110, when present) in order to form a buried weakened plane 5 in the donor substrate 11 (FIG. 2B). The buried weakened plane 5 delimits, with the front face 11a of the donor substrate 11, a surface working layer 1.

As is well known with reference to the Smart Cut™ process, these light species will form, around the implantation depth, microcavities distributed in a thin layer parallel to the front face 11a of the donor substrate 11, i.e., parallel to the plane (x,y) in the figures. This thin layer is referred to as the buried weakened plane 5, for the sake of simplicity.

The energy of implantation of the light species is chosen so as to reach a determined depth in the donor substrate 11, which depth is matched to the target thickness of the working layer 1. For example, hydrogen ions will be implanted at an energy of between 10 keV and 250 keV, and at a dose of between $5^E16/cm^2$ and $1^E17/cm^2$, to delimit a working layer 1 having a thickness of the order of 100 to 1500 nm.

It should be noted that a protective layer may be deposited on the front face 11a of the donor substrate 11 prior to the step of ion implantation of light species. This protective layer can be composed of a material such as silicon oxide or silicon nitride, for example.

Figure 2C:
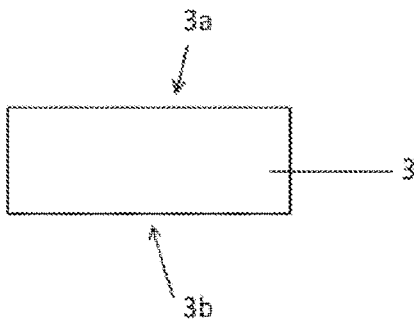

Next, the process for producing the temporary substrate 10 comprises a step c), which includes providing a carrier substrate 3 (FIG. 2C).

As mentioned above, the carrier substrate 3 provides mechanical support in the temporary substrate 10 and is not intended to be retained in the final composite structure 51 designed for a given application. Thus, the main properties of the carrier substrate 3 are preferably its low cost and its reliability as a mechanical support for the working layer 1.

Figure 2D:
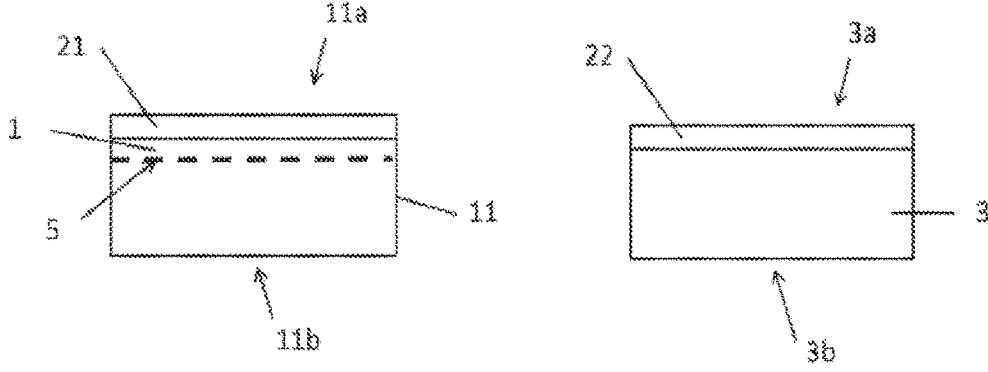

The production process next comprises a step d) of depositing at least one film 21, 22 on the donor substrate 11 and/or on the carrier substrate 3 (FIG. 2D). In other words, a first film 21 may be deposited on the front face 11a of the donor substrate 11; alternatively or in addition, a second film 22 may be deposited on the front face 3a of the carrier substrate 3. In the example illustrated in FIG. 2D, a first film 21 and a second film 22 are deposited on the donor substrate 11 and on the carrier substrate 3, respectively.

It should be noted that the at least one deposited film 21, 22 is intended to form the intermediate layer 2 of the temporary substrate 10.

The at least one deposited film 21, 22 has a thickness, along an axis z normal to the main plane (x,y), that is less than 20 nm, or even less than 10 nm, for example, between 0.3 nm and 10 nm.

By way of example, the at least one film 21, 22 may be formed by at least one material chosen from among tungsten, nickel, titanium, aluminum, molybdenum, tantalum, titanium nitride, tantalum nitride, amorphous silicon.

The deposition of step d) may be carried out using any known technique, such as, in particular, direct-liquid-injection, plasma-enhanced, thermal, chemical vapor deposition (CVD), deposition by sputtering or by evaporation.

Figure 2E:
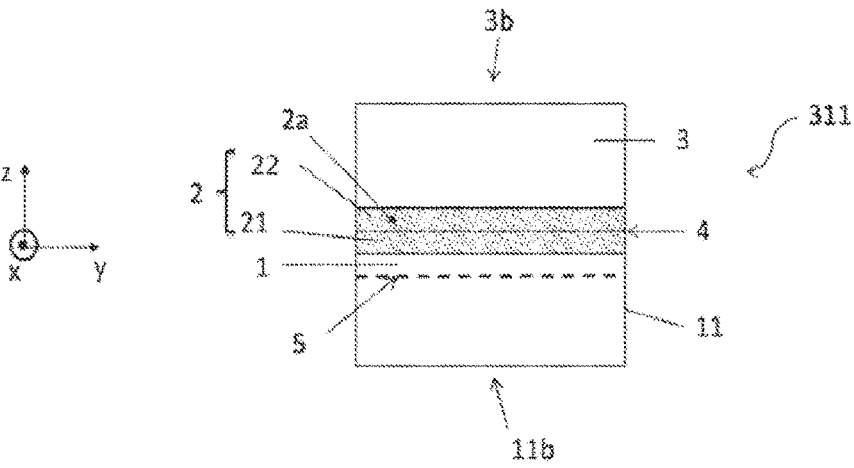

The production process next comprises a step e) of joining the donor substrate 11 and the carrier substrate 3 such that the at least one film 21, 22 is arranged between the substrates 11, 3 and forms the intermediate layer 2 (FIG. 2E).

The donor substrate 11 and the carrier substrate 3 are joined by their respective front faces 11a, 3a, forming a stack 311. As is well known per se, the two substrates may be joined using direct bonding by molecular adhesion, i.e., in the present case by placing the front faces of the substrates 11, 3 in direct contact, either or both of the faces being provided with a film 21, 22. The bonding may take place at ambient temperature or at a temperature lower than 800° C., under ambient or controlled atmosphere, for example, a vacuum.

Step e) may comprise, prior to this contact, conventional sequences of cleaning, of surface activation or other surface preparations, which may enhance the quality of the bonding interface 4 (low defect density, good adhesion quality).

The joining or bonding interface 4 is located in the intermediate layer 2, or between this layer and the working layer 1, or else between the intermediate layer 2 and the carrier substrate 3.

Figure 2F:
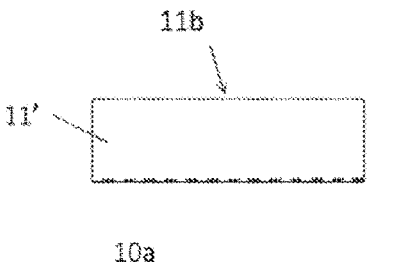
Figure 2F:
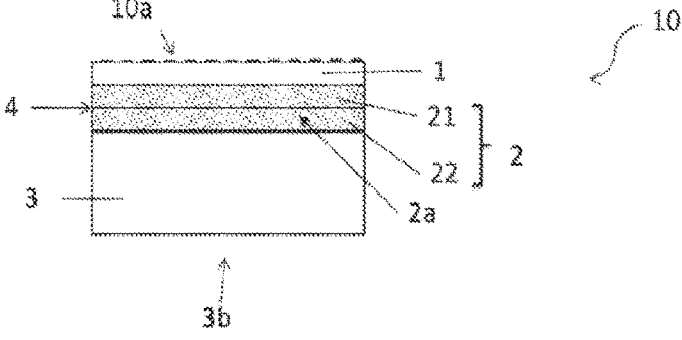

Next, the production process comprises a step f) comprising separation along the buried weakened plane 5 to form, on the one hand, the temporary substrate 10 and, on the other hand, the rest of the donor substrate 11' (FIG. 2F). The front face 10a of the temporary substrate 10 is also the front face of the working layer 1 arising from the donor substrate 11.

According to one advantageous implementation, separation step f) is performed by applying a heat treatment to the stack 311, at a separation temperature. The microcavities present in the buried weakened plane 5 follow growth kinetics until the initiation of a splitting wave, which will propagate over the entire extent of the buried weakened plane 5 and result in the separation of the temporary substrate 10 from the rest of the donor substrate 11'. In practice, for a donor substrate 11 made of silicon carbide, the temperature may be between 900° C. and 1200° C., depending on the implantation conditions of step b).

According to one alternative implementation, separation step f) is performed by applying a mechanical stress to the stack 311, after completion of the entirety or part of a heat treatment at a temperature of between 900° C. and 1200° C. The stress could be exerted, for example, by inserting a tool (e.g., razor blade) close to the buried weakened plane 5. By way of example, the separation stress may be of the order of a few GPa, preferably higher than 2 GPa.

As is known per se, on conclusion of separation step f), the front face 10a of the working layer 1 of the temporary substrate 10 has a surface roughness of between 5 and 100 nm RMS (measured with an atomic force microscope (AFM), on scans of 20 μm×20 μm).

Following the separation, step f) may optionally comprise treatments for smoothing and healing the working layer 1. In particular, mention may be made of heat treatments under controlled (oxidizing or reducing) atmosphere, wet or dry chemical etches in order to remove a damaged surface portion of the working layer 1, and/or chemical-mechanical polishing of the front face of the working layer 1 in order to restore a good level of roughness (for example, a final roughness of less than 0.5 nm RMS on an AFM field of 20×20 μm, or even less than 0.3 nm) and to potentially remove a damaged surface portion. Conventional cleaning sequences could also be applied to the temporary substrate 10, for example, cleaning of SC1/SC2 type (Standard Clean 1, Standard Clean 2) and/or HF (hydrofluoric acid), and/or an $N_2$, Ar, $CF_4$, etc., plasma, to further improve the quality of the front face 10a of the working layer 1.

Since the carrier substrate 3 is chosen so as to be matched to the working layer 1, and to be stable mechanically and at high temperatures, and the intermediate layer 2 is chosen so as to be of very low thickness, the thermal, mechanical or chemical treatments required to restore a high quality to the working layer 1 may easily be applied to the temporary substrate 10 without undesired stress or risk of damage to the working layer 1.

It should be noted that step f) could be followed by a step of epitaxial growth of an additional layer on the working layer 1 of the temporary substrate 10. Such a step is applied when a relatively substantial thickness is required for the working layer, typically of the order of a few microns to a few tens of microns, for example, from 5 μm to 50 μm. The epitaxy temperature is advantageously chosen so as to be lower than 1500° C., or even lower than 1300° C., so as to avoid prematurely initiating the detachment of the temporary substrate 10.

During or on conclusion of step f), which preferably involves a high-temperature heat treatment, the intermediate layer 2 may undergo physical and/or morphological changes. The at least one film 21, 22 may potentially form nodules intercalated with contiguous regions between the material of the working layer 1 and the material of the carrier substrate 3: the intermediate layer 2 is then formed of a discontinuous layer of nodules. The joining interface 4 is therefore itself also substantially changed: it may be located in the nodules, between the nodules and the working layer 1, between the nodules and the carrier substrate 3, and/or between the working layer 1 and the carrier substrate 3. Alternatively, the intermediate layer 2 may retain its continuous form all the way along the joining interface 4.

The production process further comprises a step of introducing atoms 2a of at least one gaseous species into the at least one film 21, 22, or close thereto. As mentioned above in the description of the temporary substrate 10, the gaseous species could be nitrogen, helium, argon, xenon and/or hydrogen. The atoms 2a of this gaseous species are those that are intended to be trapped in the intermediate layer 2, and/or in an adjacent layer of the carrier substrate 3 with a thickness less than or equal to 10 nm and/or in an adjacent sublayer of the working layer 1 with a thickness less than or equal to 10 nm.

Figure 4C:
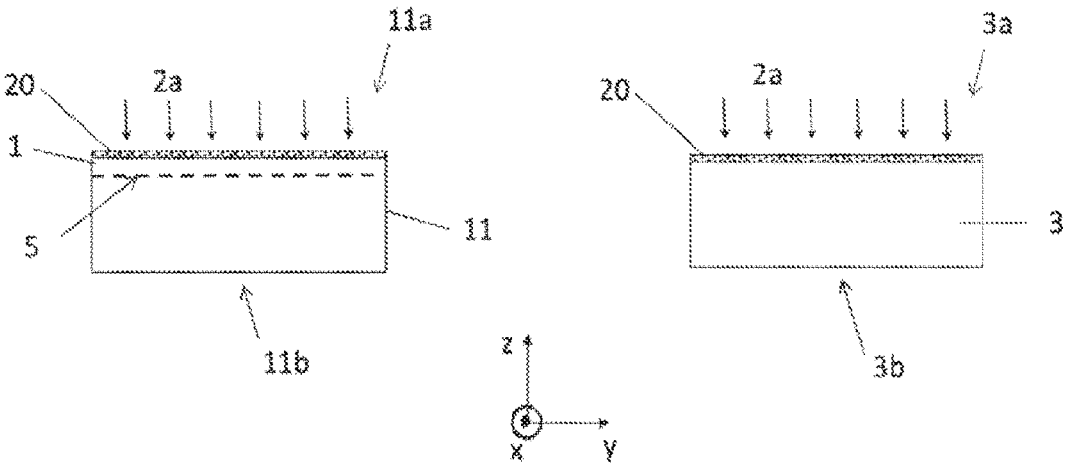
FIGS. 4C'-4F show steps of the process for producing the detachable temporary substrate according to a first implementation.

In a first implementation, illustrated in FIGS. 4C'-4F, this step of introducing atoms 2a will be called c') since it is performed prior to step d) of depositing the film 21, 22. The atoms 2a are introduced into the donor substrate 11 and/or into the carrier substrate 3 to a shallow depth, less than 10 nm from their respective front faces 11a, 3a. Ion implantation may be performed in order to introduce the atoms 2a in the form of ions into the one or more substrates 11, 3, with an ion implantation energy typically lower than 10 keV, or even lower than 5 keV, and an implantation dose typically between $2^E15/cm^2$ and a few $1^E16/cm^2$. An implanted zone 20 is thus formed close to the surface of the front face 11a of the donor substrate 11, and/or close to the surface of the front face 3a of the carrier substrate 3.

Figure 4D:
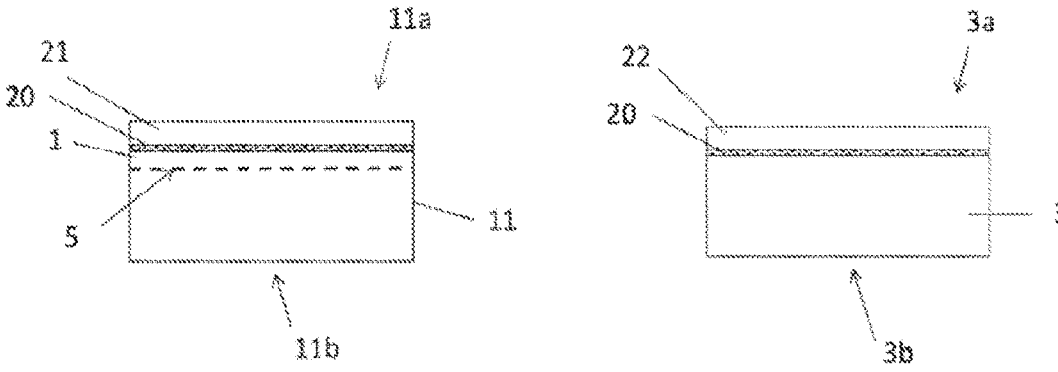
Figure 4E:
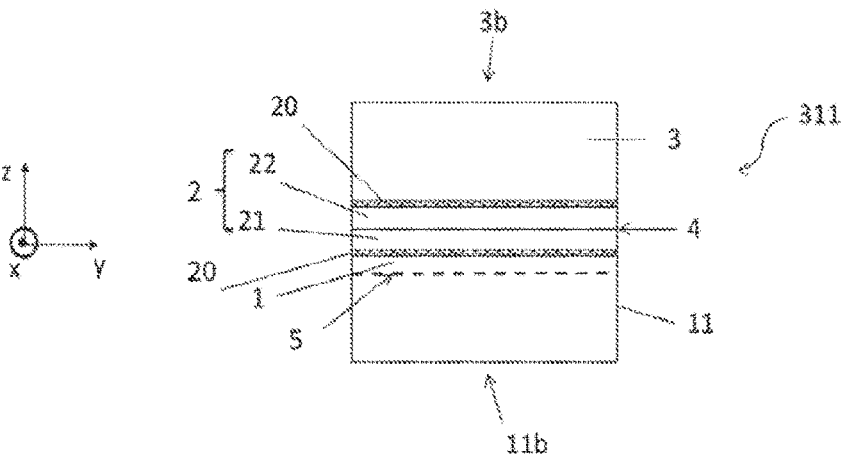
Figure 4F:
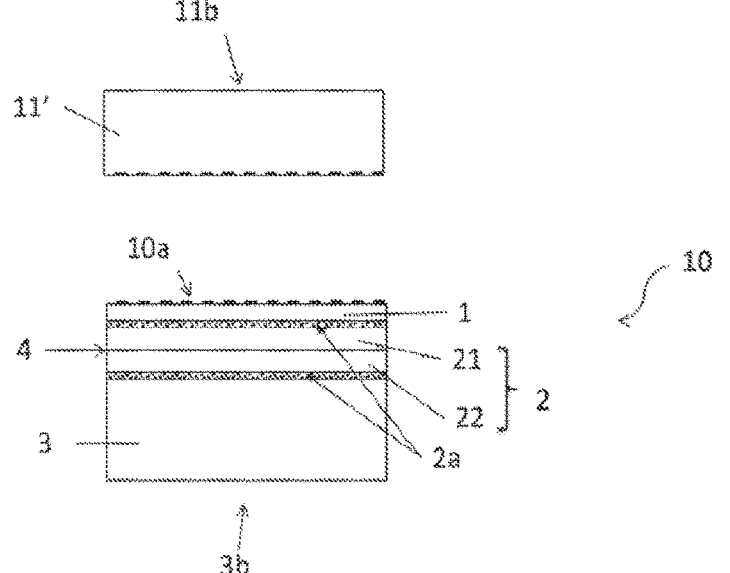

Steps d) to f) of the process are then performed as described above and are illustrated in FIGS. 4D-4F.

The atoms 2a are located in a thin layer (thickness less than or equal to 10 nm) of the carrier substrate 3, adjacent to the intermediate layer 2, and a thin sublayer (thickness less than or equal to 10 nm) of the working layer 1, adjacent to the intermediate layer 2; the adjacent layer and sublayer originate from the implanted zones 20. Depending on the nature of the gaseous species and of the intermediate layer 2, the atoms 2a might remain trapped in the aforementioned layer and sublayer or become trapped in the intermediate layer 2, during heat treatment is applied to the temporary substrate 10, as long as the latter is not subjected to a temperature higher than or equal to the detachment temperature, which is significantly higher than the separation temperature of step f).

The atoms $2a$ of the gaseous species are distributed according to a concentration profile along the axis z normal to the main plane (x,y), with a maximum concentration higher than $10^{21}/cm^3$.

Figure 5D:
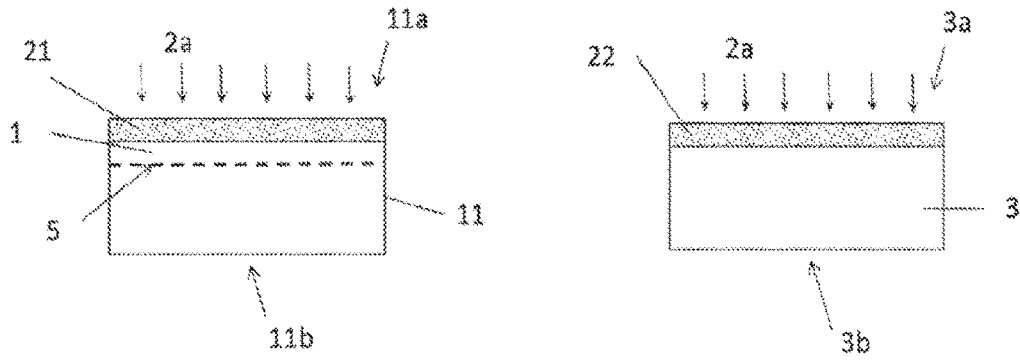
FIG. 5D' shows a step of the process for producing the detachable temporary substrate according to a second implementation of the present disclosure.

In a second implementation, illustrated in FIG. 5D', the step of introducing atoms $2a$ will be called d') since it is performed after step d) of depositing the film 21, 22.

As mentioned above, the at least one film 21, 22 may be present on the donor substrate 11 and/or on the carrier substrate 3.

The atoms $2a$ are introduced into at least one film 21, 22. Ion implantation may be performed in order to introduce the atoms $2a$ in the form of ions with an ion implantation energy typically lower than 10 keV, or even lower than 5 keV, depending on the thickness of the film 21, 22 deposited in step d). The implantation dose is typically between $2^E15/cm^2$ and a few $1^E16/cm^2$.

In the intermediate layer 2, the atoms $2a$ of the gaseous species are distributed according to a concentration profile along the axis z, with a maximum concentration, located at the implantation peak, higher than $10^{21}/cm^3$.

Steps e) to f) of the process are then performed as described above (FIGS. 2E and 2F).

Figure 6P:
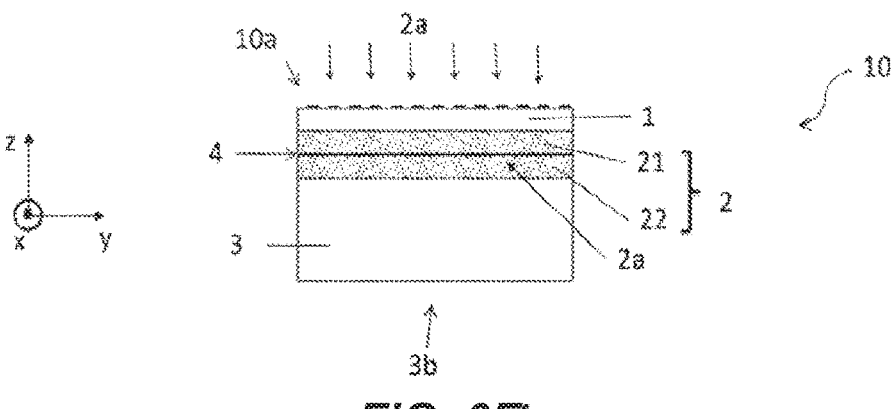
FIG. 6F' shows a step of the process for producing the detachable temporary substrate according to a third implementation of the present disclosure.

In a third implementation, illustrated in FIG. 6F', the step of introducing atoms $2a$ will be called f) since it is performed after separation step f).

The atoms $2a$ are introduced into the intermediate layer 2, for example, by ion implantation. The ion implantation energy depends, in this case, on the nature and on the thickness of the working layer 1, which the ions will pass through to reach the intermediate layer 2. The implantation dose is typically between $2^E15/cm^2$ and a few $1^E16/cm^2$.

In this case also, the atoms $2a$ of the gaseous species are distributed according to a concentration profile along the axis z, with a maximum concentration, located at the implantation peak, expected to be higher than $10^{21}/cm^3$.

In any one of the three implementations described, the total dose of implanted ions is defined such that the concentration profile of the atoms $2a$ exhibits a maximum concentration higher than $10^{21}/cm^3$ in the completed temporary substrate 10.

Introducing high doses of atoms $2a$ of the gaseous species into and/or very close to the intermediate layer 2 will allow the creation of a detachment interface in the intermediate layer 2 or adjacent thereto during the transfer process of the present disclosure, which is described below.

The present disclosure also relates to a process for transferring the working layer 1 from a temporary substrate 10 as described above to a receiver substrate 50. The transfer process is described with reference to FIGS. 7G-7J.

The receiver substrate 50 is preferably provided in the form of a wafer with a diameter of 100 mm, 150 mm, 200 mm, or even potentially 450 mm, and with a thickness typically of between 300 and 800 μm. It comprises a front face and a back face 50b, opposite one another. The receiver substrate 50 is designed for the final application, and its physical and electrical properties are therefore chosen especially for the required specifications.

For a power electronics application, for which the working layer 1 is made of, for example, silicon carbide of high crystal quality, the receiver substrate 50 could be made of, in particular, polycrystalline silicon carbide, exhibiting good electrical conductivity so as to provide a vertical conduction path.

Figure 7G:
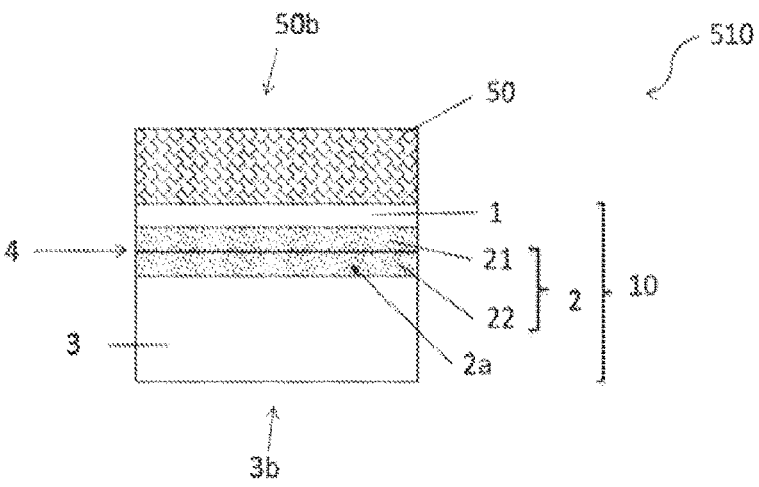
FIGS. 7G-7J show steps of a transfer process according to the present disclosure.

The transfer process comprises a step g) of forming a detachable structure 510 comprising the receiver substrate 50 arranged on the working layer 1 of the temporary substrate 10 (FIG. 7G). It should be noted that the temporary substrate 10 of FIG. 7G is illustrated with atoms $2a$ of the gaseous species trapped in the intermediate layer 2; any other configuration described above, with the atoms $2a$ in a different location, could of course be implemented.

Step g) involves a treatment at a first temperature higher than or equal to 1000° C., and advantageously lower than or equal to 1500° C.

According to a first embodiment, step g) comprises the deposition of the receiver substrate 50 on the free face 10a of the working layer 1 of the temporary substrate 10. The deposition may be carried out at a temperature (corresponding to the first temperature) higher than 1000° C., higher than or equal to 1200° C., or even higher than 1400° C., in particular, when it is desired to deposit a receiver substrate 50 made of high-quality polycrystalline silicon carbide on a working layer 1 made of very-high-quality monocrystalline silicon carbide. Of course, other materials deposited at very high temperatures might be of interest for forming the receiver substrate 50.

For applications that require electrical conduction between the working layer 1 and the receiver substrate 50, a non-insulating interface must be defined between them. In other words, step g) is carried out such that the interface between the working layer 1 and the receiver substrate 50 is electrically conductive: a specific resistance of the interface that is typically lower than 1 mohm.cm$^2$ is targeted. Advantageously, in order to ensure the electrical conductivity of the interface, removal of the native oxide present on the free face 10a of the working layer 1 is carried out by HF (hydrofluoric acid) deoxidation, via a wet or dry route. Alternatively, overdoping of the first few nanometers of the receiver substrate 50 deposited may promote the electrical conductivity of the interface between the working layer 1 and the substrate 50.

Advantageously also, prior to the deoxidation and/or to the formation of the receiver substrate 50, cleaning sequences are applied to the temporary substrate 10 to remove all or some of the particulate, metallic or organic contaminants potentially present on its free faces 10a, 3b.

In the first embodiment, it should be noted that the working layer 1 of the temporary substrate 10 does not necessarily have to undergo polishing with a view to completely restoring its surface roughness after the separation of step f). The production of the receiver substrate 50 by deposition or epitaxy at very high temperature (typically between 1100° C. and 1500° C.) may promote the healing and reconstruction of the surface of the working layer 1 and may furthermore tolerate a residual roughness.

Since the carrier substrate 3 is chosen so as to be matched to the working layer 1, and to be stable mechanically and at high temperatures, and the intermediate layer 2 is chosen so as to be of very low thickness, the thermal, mechanical or chemical treatments required for the formation of the detachable structure 510 may easily be applied to the temporary substrate 10 without undesired stress or risk of damage to the working layer 1.

In this first embodiment, the deposition of step g) may be carried out using an evaporation or a chemical vapor deposition (CVD) technique. Thermal CVD techniques such as atmospheric-pressure CVD (APCVD) or low-pressure CVD (LPCVD), or plasma-enhanced CVD (PECVD), or else direct-liquid-injection CVD (DLI-CVD), may be used.

To obtain the electrical conductivity properties required in the aforementioned power applications, and returning to the example of a receiver substrate 50 made of silicon carbide, the substrate may exhibit, for example, the following structural characteristics: polycrystalline structure, grains of 3C SiC type, 111 oriented, with a mean size of 1 to 50 μm, n-type doping for a final resistivity lower than or equal to 0.03 ohm.cm.

On conclusion of step g), the receiver substrate 50 has a thickness that is typically greater than or equal to 50 μm, or even a thickness greater than or equal to 100 μm, for example, of the order of 300 μm. The detachable structure 510 resulting from step g) comprises the receiver substrate 50 arranged on the working layer 1, itself included within the temporary substrate 10. The first temperature implemented for the production of the receiver substrate 50 is lower than the detachment temperature, and therefore the atoms 2a of the gaseous species remain mostly trapped in the intermediate layer 2 and/or in an adjacent layer of the carrier substrate 3 with a thickness less than or equal to 10 nm and/or in an adjacent sublayer of the working layer 1 with a thickness less than or equal to 10 nm.

According to a second embodiment in which the receiver substrate 50 is a bulk substrate, step g) comprises an operation of joining the receiver substrate 50 to the free face 10a of the working layer 1 of the temporary substrate 10, to form the detachable structure 510.

The joining operation may be performed using any known technique, in particular, using direct bonding by molecular adhesion, or thermocompression bonding or another type of bonding compatible with very high temperatures. To consolidate this bonding, step g) further comprises a heat treatment at a temperature (corresponding to the first temperature) higher than or equal to 1000° C., or even higher than or equal to 1200° C.

Figure 7H:
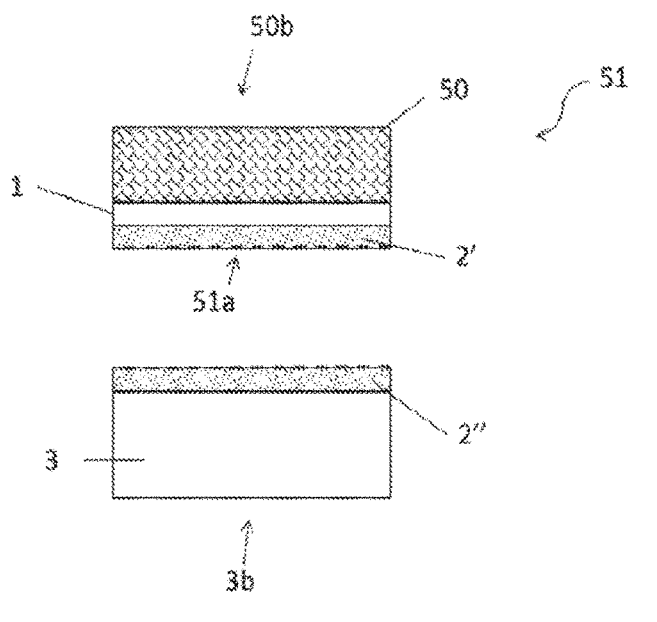

The transfer process according to the present disclosure next comprises a step h) of detaching the detachable structure 510 along a detachment interface located in the intermediate layer 2 or adjacent thereto. This step forms, on the one hand, a composite structure 51 comprising the working layer 1 arranged on the receiver substrate 50 and, on the other hand, the carrier substrate 3 (FIG. 7H). The detachment step involves a heat treatment at a detachment temperature higher than the separation temperature of step f) and higher than the first temperature applied in step g). The detachment temperature is higher than 1000° C.

Typically, in the particular case of an intermediate layer 2 comprising tungsten implanted with atoms 2a of nitrogen, a working layer 1 and a carrier substrate 3 made of SiC, the detachment temperature may be made to be higher than or equal to 1400° C., or even higher than or equal to 1500° C., for example, 1600° C. or 1700° C.

The atoms 2a present in the temporary substrate 10 migrate over the course of the heat treatment of step h) and accumulate at a detachment interface coincident with or close to the joining interface 4, in the intermediate layer 2 or adjacent to the intermediate layer 2. The gaseous species then generate pressurized microcracks that grow in pressure and cause detachment inside the detachable structure 510 and over its entire area, parallel to the main plane (x,y).

According to one particular embodiment, the intermediate layer 2 undergoes, during step h) or beforehand during a prior heat treatment, segmentation into the form of nodules. These nodules are then intercalated with contiguous regions between the material of the working layer 1 and the material of the carrier substrate 3. The accumulation of the gaseous species that takes place in step h) then preferentially occurs at the contiguous regions, leading to pressurized microcracks.

The detachment phenomenon in the transfer process according to the present disclosure is particularly advantageous because it takes place only at a detachment temperature, higher than the very high temperatures applied beforehand to the temporary substrate 10 or to the detachable structure 510, and therefore provides access to several types of steps for forming the detachable structure 510. In particular, high first temperatures make it possible to obtain a very-high-quality receiver substrate 50 (in the first embodiment) and/or a very-high-quality join of the receiver substrate 50 to the working layer 1 (in the second embodiment) without causing premature progression of the detachment interface at the intermediate layer 2.

It is therefore possible, in a second stage, and at the higher detachment temperature, to trigger the detachment of the detachable structure 510 and form the composite structure 51.

The transfer process according to the present disclosure may next comprise a step i) of finishing the composite structure 51, including an operation of chemical cleaning and/or chemical etching and/or chemical-mechanical polishing of the free face of the working layer 1, front face 51a of the composite structure 51. It should be noted that chemical etching or polishing may be useful for removing residues of the intermediate layer 2' from the front face 51a of the composite structure 51.

Step i) may also comprise an operation of chemical cleaning and/or chemical etching and/or mechanical grinding and/or chemical-mechanical polishing applied to the free face 50b of the receiver substrate 50, back face 50b of the composite structure 51.

Polishing or grinding of the edges of the composite structure 51 may also be carried out during this step i) in order to render the shape of its circular outline and of the edge waste compatible with the requirements of microelectronics production processes, in particular, in the first embodiment, for which the receiver substrate 50 is formed by deposition.

Lastly, step i) may comprise epitaxial growth of an additional layer on the working layer 1 of the composite structure 51. Such a step is applied when the thickness of the working layer 1 transferred from the temporary substrate 10 is not sufficient for the production of components, or when a layer with a particular doping type or particular composition is required on the surface of the working layer 1 for the components.

Optionally, the transfer process may comprise a step g') of treating the detachable structure 510, prior to detachment step h), which includes an operation of chemical cleaning and/or chemical etching and/or mechanical grinding and/or chemical-mechanical polishing of the back face 50b of the receiver substrate 50 and, potentially, grinding of the edges of the detachable structure 510. This makes it possible to treat and refine the shape and thickness of the receiver substrate 50 without risk of damaging the working layer 1, which is still buried in the detachable structure 510.

Figures 7I, 7J:
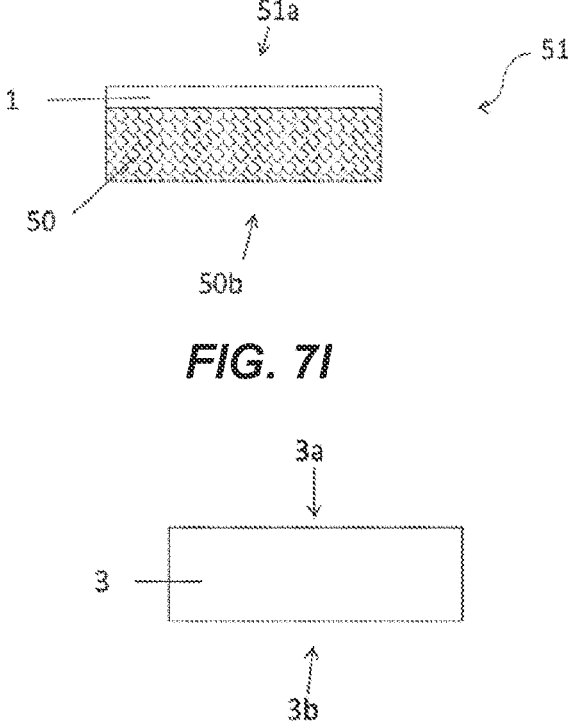

Lastly, the transfer process according to the present disclosure may comprise a step j) of reconditioning the carrier substrate 3, in particular, with a view to reusing it as carrier substrate for a new temporary substrate 10 (FIG. 7J). Such a reconditioning step is based on one or more treatments of the front face of the substrate 3 on conclusion of step h), by surface or edge chemical-mechanical polishing, and/or by mechanical grinding, and/or by wet or dry chemical etching.

EXEMPLARY IMPLEMENTATIONS

According to one non-limiting exemplary implementation, the initial substrate 111 provided in step a) of the production process is a wafer made of c-SiC of 4H polytype, with an orientation of 4.0°±0.5° relative to the <11-20> axis, with a diameter of 150 mm and a thickness of 350 μm. A conventional cleaning sequence of RCA type (Standard Clean 1+Standard Clean 2), then Caro's acid (mixture of sulfuric acid and hydrogen peroxide) and then HF (hydrofluoric acid), is carried out on the initial substrate 111 prior to the epitaxial growth of the donor layer 110 made of c-SiC.

The growth is performed in an epitaxy chamber at a temperature of 1650° C. with precursors such as monosilane (SiH$_4$) and propane (C$_3$H$_8$) or ethylene (C$_2$H$_4$), generating the c-SiC donor layer 110 with a thickness of 30 μm (rate of growth: 10 μm/h). The donor layer 110 has a BPD defect density of the order of 1/cm$^2$.

The hydrogen ions implanted in step b) are implanted at an energy of 150 keV and a dose of 6$^E$16 H+/cm$^2$ through the free surface of the donor layer 110. A buried weakened plane 5 is thus created at a depth of approximately 800 nm in the donor layer 110.

A carrier substrate 3 made of monocrystalline silicon carbide of low crystal quality with a diameter of 150 mm and a thickness of 550 μm is provided in step c).

A cleaning sequence of RCA type+Caro's acid is applied to the donor substrate 11 and to the carrier substrate 3 so as to remove potential contaminants from their free faces.

Tungsten is deposited with a thickness of 0.5 nm (step d)) on the front face 11a of the donor substrate 11 and on the front face 3a of the carrier substrate 3 using chemical vapor deposition at a temperature of the order of 700° C. in order to form a first film 21 and a second film 22.

Nitrogen (step d')) is implanted into the film 21 of the donor substrate 11 with implantation energy of 5 keV and a dose of 1$^E$16/cm$^2$ so as to place the implantation peak (maximum concentration) in the film 21.

Step e) next provides the bonding by molecular adhesion of the implanted film 21 of the donor substrate 11 to the film 22 of the carrier substrate 3 along a bonding interface 4 so as to form the stack 311. The two films 21, 22 form the intermediate layer 2.

Separation step f) takes place along the buried weakened plane 5, by applying a heat treatment at 950° C. for several tens of minutes, or even an hour. The temporary substrate 10 is thus formed, with the surface working layer 1. The rest of the donor substrate 11' may be reconditioned and reused for a new cycle.

An operation of chemical-mechanical polishing removing approximately 200 nm from the surface of the working layer 1 is performed, as well as a heat treatment for healing the working layer 1, at a temperature higher than or equal to 1000° C. During this step, the atoms 2a of the gaseous species remain mostly trapped in the intermediate layer 2.

With a view to transferring the working layer 1 to the receiver substrate 50 in order to produce the composite structure 51, an operation of LP-CVD deposition of polycrystalline silicon carbide is performed on the working layer 1 of the temporary substrate 10 at a temperature of 1250° C., with the methylsilane precursor, for 120 minutes, so as to reach a thickness of 360 μm for the receiver substrate 50. Under these conditions, the receiver substrate 50 is a polycrystal of very high quality (step g)). Steps of grinding and/or polishing could be carried out in order to adjust the thickness of the receiver substrate 50 and potentially the shape of its peripheral edges. The detachable structure 510 is thus created.

Detachment step h) corresponds to a heat treatment at 1700° C. applied to the detachable structure 510. A detachment interface, resulting from the diffusion of the atoms 2a of nitrogen trapped in the intermediate layer 2 and their accumulation to form pressurized microcracks at the bonding interface 4 or very close thereto, forms in the intermediate layer 2 until it causes the complete detachment of the detachable structure 510. Thus, what is obtained is the composite structure 51 comprising the working layer 1 arranged on the receiver substrate 50 on the one hand and the carrier substrate 3 on the other hand. The composite structure 51 and the carrier substrate 3 each comprise a remnant 2', 2" of the intermediate layer 2, which may be removed, for example, by polishing or by chemical etching.

Mechanical grinding or chemical-mechanical polishing is preferably applied to the back face of the composite structure 51 if it was not performed on the detachable structure 510.

In principle, the front face 51a of the structure 51, corresponding to the free face 51a of the working layer 1, does not require conventional cleaning since the quality of the layer and the low roughness thereof were acquired in the temporary substrate 10.

Vertical components may next be produced on the composite structure 51, potentially after the epitaxial growth of an additional layer on the working layer 1.

Under conditions similar to those described in the example above, the material of the at least one film 21, 22 could be amorphous silicon and the introduced atoms 2a could be argon or helium.

Needless to say, the present disclosure is not limited to the described embodiments and examples, and implementation variants may be applied thereto without departing from the scope of the invention as defined by the claims.

The invention claimed is:

1. A temporary substrate, which is detachable at a detachment temperature higher than 1000° C., comprising:
   a semiconductor working layer extending along a main plane;
   a carrier substrate;
   an intermediate layer arranged between the semiconductor working layer and the carrier substrate, the intermediate layer having a thickness, along an axis normal to the main plane, less than 20 nm;
   a bonding interface located in the intermediate layer or adjacent thereto; and
   atoms of at least one gaseous species being distributed according to a concentration profile along the axis normal to the main plane with a maximum concentration higher than 10$^{21}$/cm$^3$, wherein the atoms, the intermediate layer, the carrier substrate, and the semiconductor working layer are configured such that the atoms remain trapped in the intermediate layer and/or in an adjacent layer of the carrier substrate with a thickness less than or equal to 10 nm and/or in an adjacent sublayer of the semiconductor working layer with a thickness less than or equal to 10 nm when the temporary substrate is subjected to a temperature lower than the detachment temperature, and such that the atoms diffuse to a detachment interface when the temporary substrate is subjected to a temperature higher than or equal to the detachment temperature,
   wherein the intermediate layer comprises at least one material chosen from among tungsten, nickel, titanium, aluminum, molybdenum, tantalum, titanium nitride, tantalum nitride, or amorphous silicon.

2. The temporary substrate of claim 1, wherein the at least one gaseous species is nitrogen, helium, argon, xenon and/or hydrogen.

3. The temporary substrate of claim 2, wherein the carrier substrate comprises a material, a coefficient of thermal expansion of which is equal to or close to that of the semiconductor working layer.

4. A method for producing a temporary substrate according to claim 1, comprising:

a) a step of providing a donor substrate;

b) a step of implanting light ions chosen from among hydrogen, helium, or a combination of the two into the donor substrate to form a buried weakened plane in the donor substrate, the buried weakened plane delimiting a surface working layer with a front face of the donor substrate;

c) a step of providing the carrier substrate having a front face;

d) a step of depositing at least one film on the front face of the donor substrate and/or on the front face of the carrier substrate;

e) joining the donor substrate and the carrier substrate such that the at least one film is arranged between the donor substrate and the carrier substrate so as to form the intermediate layer; and f) separating along the buried weakened plane to form the temporary substrate and a remainder of the donor substrate;

wherein the method further comprises a step of introducing atoms of the at least one gaseous species:

into the donor substrate and/or into the carrier substrate to a depth less than or equal to 10 nm from their respective front faces, before deposition step d), or into the at least one film, after deposition step d), or into the intermediate layer, after separation step f).

5. The method of claim 4, wherein step f) comprises a heat treatment at a temperature of between 900° C. and 1200° C.

6. A method for transferring a working layer from a temporary substrate according to claim 1 to a receiver substrate, the method comprising:

g) a step of forming a detachable structure comprising the receiver substrate arranged on the semiconductor working layer of the temporary substrate, the formation step involving a treatment at a first temperature higher than or equal to 1000° C.; and h) a step of detaching the detachable structure along the detachment interface in or adjacent to the intermediate layer, the detachment step comprising a heat treatment at the detachment temperature higher than the first temperature to form a composite structure comprising the semiconductor working layer arranged on the receiver substrate and the separate carrier substrate.

7. The method of claim 6, wherein step g) comprises deposition of the receiver substrate on a free face of the semiconductor working layer of the temporary substrate.

8. The method of claim 7, wherein the deposition of the receiver substrate is performed by, thermal or enhanced, chemical vapor deposition, or by evaporation, at a temperature higher than or equal to 1000° C.

9. The method of claim 7, wherein the receiver substrate comprises polycrystalline silicon carbide.

10. The method of claim 6, wherein step h) comprises a heat treatment at a temperature higher than or equal to 1400° C.

11. The method of claim 6, further comprising a step i) of finishing the composite structure, including an operation of chemical cleaning and/or chemical etching and/or chemical-mechanical polishing of a free face of the semiconductor working layer.

12. The method of claim 11, wherein step i) comprises an operation of chemical cleaning and/or chemical etching and/or mechanical grinding and/or chemical-mechanical polishing of a free face of the receiver substrate.

13. The method of claim 6, further comprising a step g') of treating the detachable structure, prior to detachment step h), including an operation of chemical cleaning and/or chemical etching and/or mechanical grinding and/or chemical-mechanical polishing of a back face of the receiver substrate.

14. The method of claim 6, further comprising producing electronic components in or on the semiconductor working layer of the composite structure.

15. The method of claim 14, further comprising epitaxially growing an additional layer on the semiconductor working layer prior to producing the electronic components in or on the semiconductor working layer.

16. The method of claim 8, wherein the deposition of the receiver substrate is performed at a temperature higher than or equal to 1200° C.

17. The method of claim 10, wherein step h) comprises a heat treatment at a temperature higher than or equal to 1500° C.

18. The temporary substrate of claim 1, wherein the at least one gaseous species is nitrogen, helium, argon, xenon and/or hydrogen.

19. The temporary substrate of claim 1, wherein the carrier substrate comprises a material, a coefficient of thermal expansion of which is equal to or close to that of the semiconductor working layer.

* * * * *